United States Patent
Freitag

(12) 
(10) Patent No.: US 7,263,449 B1
(45) Date of Patent: Aug. 28, 2007

(54) METHOD FOR DETERMINING POOR PERFORMING CELLS

(75) Inventor: Gary Freitag, East Aurora, NY (US)

(73) Assignee: Greatbatch Ltd., Clarence, NY (US)

( * ) Notice: Subject to any disclaimer, the term of this patent is extended or adjusted under 35 U.S.C. 154(b) by 92 days.

(21) Appl. No.: 11/015,991

(22) Filed: Dec. 17, 2004

Related U.S. Application Data

(63) Continuation-in-part of application No. 10/277,596, filed on Oct. 22, 2002, now abandoned.

(60) Provisional application No. 60/336,848, filed on Oct. 23, 2001.

(51) Int. Cl.
G01R 31/36 (2006.01)

(52) U.S. Cl. .............. 702/63; 702/65; 702/79; 429/90

(58) Field of Classification Search .......... 702/20, 702/57, 60, 63–66, 149, 189, 71, 79, 81, 702/82, 176; 429/3, 50, 122, 326, 90; 320/134, 320/136
See application file for complete search history.

(56) References Cited

U.S. PATENT DOCUMENTS 4,839,248 A * 6/1989 Magnussen et al. .......... 429/49
5,435,874 A * 7/1995 Takeuchi et al. ............ 156/242
5,569,558 A   10/1996 Takeuchi et al.
5,571,640 A   11/1996 Takeuchi et al.
5,580,683 A   12/1996 Takeuchi et al.
5,616,429 A *  4/1997 Klementowski ................ 429/3
6,063,526 A *  5/2000 Gan et al. .................... 429/326
6,165,638 A   12/2000 Spillman et al.
6,166,524 A * 12/2000 Takeuchi et al. ............ 320/132
6,228,534 B1 * 5/2001 Takeuchi et al. ............ 429/219
6,274,269 B1 * 8/2001 Gan et al. .................... 429/215
6,503,646 B1 * 1/2003 Ghantous et al. ............... 429/3
6,551,747 B1   4/2003 Gan
2003/0088378 A1* 5/2003 Freitag ........................ 702/117

* cited by examiner

Primary Examiner—Jeffrey R. West
(74) Attorney, Agent, or Firm—Michael F. Scalise

(57) ABSTRACT

A means for determining long-term discharge performance, particularly in a lithium/silver vanadium oxide cell, by analyzing and characterizing the initial pulse voltage waveform, is described. The relationship between the initial P1 ($P_{min}$) voltage drop and the extent of that initial voltage drop with $P_{last}$ (the final voltage under load) is a reliable indication of long-term discharge performance.

20 Claims, 6 Drawing Sheets

METHOD FOR DETERMINING POOR PERFORMING CELLS

CROSS REFERENCE TO RELATED APPLICATION

This application is a continuation-in-part of application Ser. No. 10/277,596, filed Oct. 22, 2002, now abandoned, which claimed priority from U.S. provisional application Ser. No. 60/336,848, filed Oct. 23, 2001.

BACKGROUND OF THE INVENTION

1. Field of the Invention

The present invention generally relates to an alkali metal electrochemical cell, and more particularly, to a lithium cell suitable for current pulse discharge applications. More particularly, the present invention characterizes the shape of the first pulse during cell burn-in discharge or otherwise, to predict long-term performance. A particularly preferred electrochemical couple is a lithium/silver vanadium oxide cell (Li/SVO). The discharge characterization is especially important in the transition between the first and second voltage plateaus of a Li/SVO cell discharge where voltage delay typically occurs.

2. Prior Art

Efforts have been made to develop a test administered at the beginning of a cell's life that will be indicative of its long-term performance. Such a test would be useful as a means of screening out poor performers, problem solve root causes to various performance issues, and determine and identify the impact of certain factors or changes in components and manufacturing processes. Conventional methods include subjecting the cells to elevated temperature storage or Arhennius type accelerations, or comparison of individual cell burn-in data to the general population.

For example, U.S. Pat. No. 5,616,429 to Klementowski teaches conditioning a lithium/silver vanadium oxide cell by heating it at an elevated temperature of at least about 75° C. for an extended period of time longer than seven days. This is done so that when the cell is later subjected to a current pulse application, it will be at a high pulse rate without appreciable voltage delay. To show that such conditioning has its intended benefit, Klementowski subjected a test matrix of 132 Li/SVO cells to either an accelerated pulse test (APT), a 1-year accelerated discharge data (ADD) test, a 3-year ADD test or a 5-year ADD test. However, as stated at column 5, line 38 to column 6, line 5 of this patent, prior to pulse discharge testing, "all cells were subjected to a standard burn-in which consists of a 2.49 KΩ load for 17 hours, followed by an open circuit 'rest' period and a single pulse train of four, 2.0 amp pulses; 10 seconds on and 15 seconds open circuit per pulse at one week after elevated temperature conditioning." It is known that burn-in discharge typically depletes a cell of about 2% of its total capacity. This means that every cell Klementowski used to determine what the minimum conditioning temperature must be and for what time duration to have a beneficial effect on subsequent pulse discharging was first depleted of about 2% of its total capacity.

On the other hand, the present invention consists of calculating the $P_{last} - P_{min}$ for a subject cell in comparison to that for a reference cell, both pulse discharged to deliver a first pulse or pulse train at the very beginning of their lives when they are new or freshly built cells. This is in contrast to depleting about 2% of the cell's total discharge capacity during burn-in before performing further APT or ADD tests as taught by Klementowski. Instead, it is desirable when the cell is essentially at the beginning of its discharge life (about 0% to about 1% DoD) to determine whether it will experience increased voltage delay under current pulse discharge conditions at some later stage in its depth of discharge in comparison to a second cell. This means that it is within the scope of the invention to have the cell experience some discharge, whether intended or self-discharge, prior to performing the calculation.

Furthermore, elevated temperature type tests introduce unknown or undefined reactions that may invalidate the correlation. Also, these tests often take months to produce a relationship and cannot be used for early screening purposes. Comparison of individual burn-in data to the general population can be used as a screen for gross performance issues, but is unable to differentiate between poor and good performers under long-term discharge, especially in the voltage delay region typically seen with SVO chemistry.

Prior work also shows a lack of correlation between an initial pulse minimum voltage ($P_{min}$) or open current voltage (OCV) values and long-term performance. Many factors contribute to variation in burn-in results that confound and prevent developing a definitive link between initial and long-term performance. Higher initial pulse voltages do not necessarily indicate better long-term performance.

Therefore, there is a need for a test that is relatively easy to administer and evaluate and that differentiates between cells prone to experiencing unacceptable voltage delay and those that will not.

SUMMARY OF THE INVENTION

Voltage delay and irreversible Rdc growth are phenomena typically exhibited in an alkali metal/mixed metal oxide cell, and particularly, a Li/SVO cell that has been depleted of about 25% to 70% of its capacity and is being subjected to current pulse discharge applications. This is predominantly during the first and second voltage plateaus typical of a Li/SVO discharge. The voltage response of a cell that does not exhibit voltage delay during the application of a short duration pulse or pulse train has distinct features. First, the cell potential decreases throughout the application of the pulse until it reaches a minimum at the end of the pulse, and second, the minimum potential of the first pulse in a series of pulses is higher than the minimum potential of the last pulse. FIG. 1 is a graph showing an illustrative discharge curve 10 as a typical or "ideal" response of a cell during the application of a series of pulses as a pulse train that does not exhibit voltage delay.

The voltage response of a cell that exhibits voltage delay during the application of a short duration pulse or during a pulse train can take one or both of two forms. One is that the leading edge potential of the first pulse is lower than the end edge potential of the first pulse. In other words, the voltage of the cell at the instant the first pulse is applied is lower than the voltage of the cell immediately before the first pulse is removed. The second form of voltage delay is that the minimum potential of the first pulse is lower than the minimum potential of the last pulse when a series of pulses have been applied. FIG. 2 is a graph showing an illustrative discharge curve 12 as the voltage response of a cell that exhibits both forms of voltage delay.

The initial drop in cell potential during the application of a short duration pulse reflects the resistance of the cell, i.e., the resistance due to the cathode, anode, electrolyte, surface films and polarization. In the absence of voltage delay, the resistance due to passivated films on the anode and/or cathode is negligible. In other words, the drop in potential between the background voltage and the lowest voltage under pulse discharge conditions, excluding voltage delay, is an indication of the conductivity of the cell, i.e., the conductivity of the cathode, anode, electrolyte, and surface films, while the gradual decrease in cell potential during the application of the pulse train is due to the polarization of the electrodes and the electrolyte.

The present invention provides a means of determining long-term performance by analyzing and characterizing the initial pulse voltage waveform to determine whether a particular cell has unacceptable levels of passivation at the anode and cathode interfaces with the electrolyte. It can be shown that the relationship between the initial P1 ($P_{min}$) voltage drop and the extent of that initial voltage drop with $P_{last}$ (the final voltage under load) is a reliable indication of long-term discharge performance. If the difference in this calculation for a first cell and a second cell is less than about 20 mV, there will not be any significant difference in the voltage delay performance between the cells in later stages of their depth of discharge. However, when the difference is greater than about 20 mV, there will be a significant difference in the voltage delay performance at later stages of depth of discharge between the first and second cells.

DETAILED DESCRIPTION OF THE PREFERRED EMBODIMENTS

Figure 1:
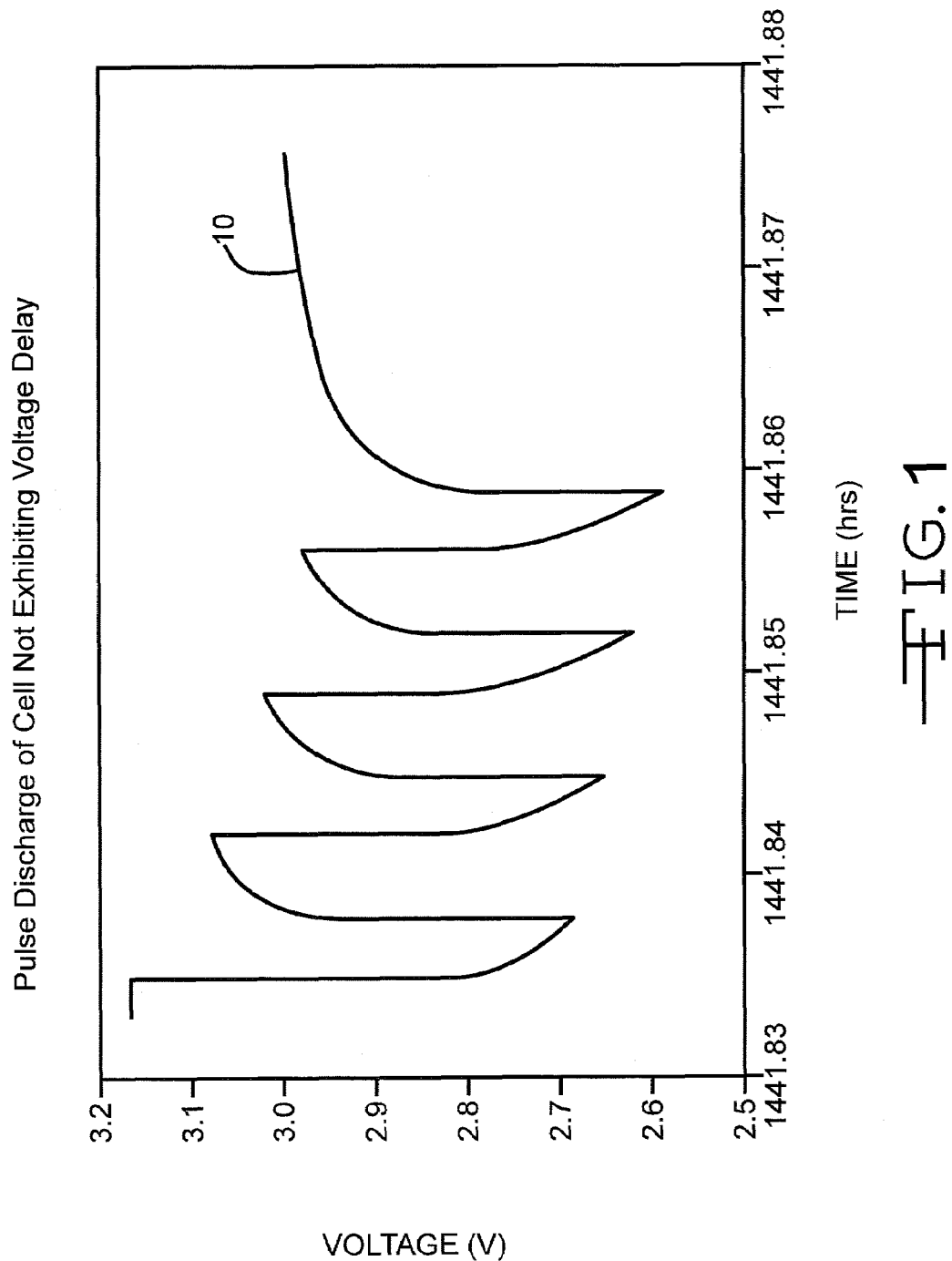
FIG. 1 is a graph showing an illustrative pulse discharge curve 10 of an exemplary electrochemical cell that does not exhibit voltage delay.
Figure 2:
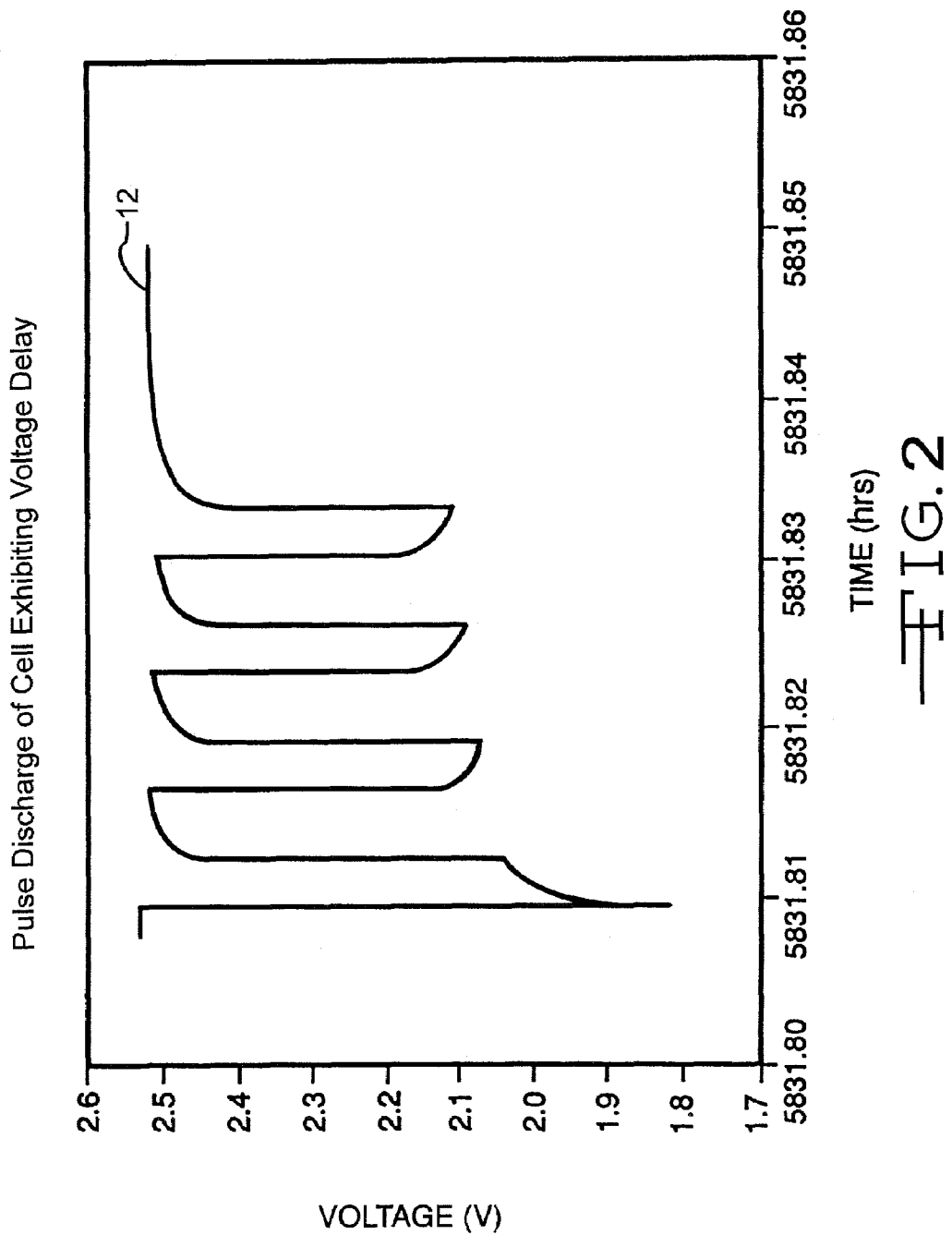
FIG. 2 is a graph showing an illustrative pulse discharge curve 12 of an exemplary electrochemical cell that exhibits voltage delay.

The term percent depth-of-discharge (% DOD) is defined as the ratio of delivered capacity to theoretical capacity, times 100.

The term "pulse" means a short burst of electrical current of significantly greater amplitude than that of a pre-pulse current or open circuit voltage immediately prior to the pulse. A pulse train consists of at least one pulse of electrical current. The pulse is designed to deliver energy, power or current. If the pulse train consists of more than one pulse, they are delivered in relatively short succession with or without open circuit rest between the pulses. An exemplary pulse train may consist of one to four 5 to 20-second pulses (23.2 mA/cm$^2$) with about a 10 to 30 second rest, preferably about 15 second rest, between each pulse. A typically used range of current densities for cells powering implantable medical devices is from about 15 mA/cm$^2$ to about 50 mA/cm$^2$, and more preferably from about 18 mA/cm$^2$ to about 35 MA/cm$^2$. Typically, a 10 second pulse is suitable for medical implantable applications. However, it could be significantly shorter or longer depending on the specific cell design and chemistry and the associated device energy requirements. Current densities are based on square centimeters of the cathode electrode.

An electrochemical cell according to the present invention includes an anode electrode selected from Group IA of the Periodic Table of Elements, including lithium, sodium, potassium, etc., and their alloys and intermetallic compounds including, for example Li—Si, Li—B and Li—Si—B alloys and intermetallic compounds. The preferred anode comprises lithium, and the more preferred anode comprises a lithium alloy, the preferred lithium alloy being lithium-aluminum with the aluminum comprising from between about 0% to about 50% by weight of the alloy. The greater the amounts of aluminum present by weight in the alloy, however, the lower the energy density of the cell.

The form of the anode may vary, but preferably it is a thin metal sheet or foil of the anode metal pressed or rolled on a metallic anode current collector, i.e., preferably comprising nickel, to form an anode component. In the exemplary cell of the present invention, the anode component has an extended tab or lead of the same material as the anode current collector, i.e., preferably nickel, integrally formed therewith, such as by welding and contacted by a weld to a cell case of conductive metal in a case-negative electrical configuration. Alternatively, the anode may be formed in some other geometry, such as a bobbin shape, cylinder or pellet to allow an alternate low surface cell design.

The cathode material comprises a mixed metal oxide formed by chemical addition, reaction or otherwise intimate contact by a thermal spray coating process of various metal sulfides, metal oxides or metal oxide/elemental metal combinations.

By way of illustration, and in no way intended to be limiting, an exemplary cathode active material comprises silver vanadium oxide having the general formula $Ag_xV_2O_y$, in any one of its many phases, i.e. β-phase silver vanadium oxide having in the general formula x=0.35 and y=5.18, γ-phase silver vanadium oxide having in the general formula x=0.74 and y=5.37 and ε-phase silver vanadium oxide having in the general formula x=1.0 and y=5.5, and combinations and mixtures of phases thereof.

Another preferred composite transition metal oxide cathode material includes $V_2O_z$ wherein z≦5 combined with $Ag_2O$ having silver in either the silver(II), silver(I) or silver(O) oxidation state and CuO with copper in either the copper(II), copper(I) or copper(0) oxidation state to provide the mixed metal oxide having the general formula $Cu_xAg_yV_2O$, (CSVO). Thus, the composite cathode active material may be described as a metal oxide-metal oxide-metal oxide, a metal-metal oxide-metal oxide, or a metal-metal-metal oxide and the range of material compositions found for $Cu_xAg_yV_2O_z$ is preferably about 0.01≦z≦6.5. Typical forms of CSVO are $Cu_{0.16}Ag_{0.67}V_2O_z$ with z being about 5.5 and $Cu_{0.5}Ag_{0.5}V_2O$ with z being about 5.75. The oxygen content is designated by z since the exact stoichiometric proportion of oxygen in CSVO varies depending on whether the cathode material is prepared in an oxidizing atmosphere such as air or oxygen, or in an inert atmosphere such as argon, nitrogen and helium. For a more detailed description of this cathode active material, reference is made to U.S. Pat. Nos. 5,472,810 to Takeuchi et al. and 5,516,340 to Takeuchi et al., both of which are assigned to the assignee of the present invention and incorporated herein by reference.

Other suitable cathode materials include copper vanadium oxide, manganese dioxide, titanium disulfide, copper oxide, copper sulfide, iron sulfide, and iron disulfide. Carbon and fluorinated carbon are also useful cathode active materials. The solid cathode exhibits excellent thermal stability and is generally safer and less reactive than a non-solid cathode.

Such cathode active materials are formed into a cathode electrode with the aid of a binder material. Suitable binders are powdered fluoro-polymers; more preferably powdered polytetrafluoroethylene or powdered polyvinylidene fluoride. Further, up to about 10 weight percent of a conductive diluent is preferably added to the cathode mixture to improve conductivity. Suitable materials for this purpose include acetylene black, carbon black and/or graphite or a metallic powder such as powdered nickel, aluminum, titanium and stainless steel. The preferred cathode active mixture thus includes a powdered fluoro-polymer binder present at about 1 to 5 weight percent, a conductive diluent present at about 1 to 5 weight percent and about 90 to 98 weight percent of the cathode active material.

The cathode electrode is formed either by rolling, spreading or pressing the cathode active mixture onto a suitable current collector. Another preferred method for building a cathode electrode is to press a freestanding sheet of the active mixture to a current collector. This method is illustrated in the block diagram flow chart of FIG. 3 and begins by taking granular cathode active material and adjusting its particle size to a useful range. This is done by comminuting the cathode material in attrition or grinding step 20. A ball mill or vertical ball mill is preferred and typical grinding times range from between about 10 to 15 minutes. The finely divided cathode material is preferably mixed with one of the above-described conductive diluents and binder materials to form a depolarizer cathode admixture in the step designated 22. Preferably, the admixture comprises about 3 weight percent of the conductive diluents and about 3 weight percent of the binder material. This is typically done in a solvent of either water or an inert organic medium such as mineral spirits. The mixing process provides for the fibrillation of the fluoro-resin to ensure material integrity. In some cases, no electronic conductor material or binder is required and the percent cathode active material is preferably held between about 80 percent to about 99 percent. After mixing sufficiently to ensure homogeneity in the admixture, the cathode admixture is removed from the mixer as a paste.

The admixture paste is then fed into a series of roll mills that compact the cathode material into a thin sheet having a tape form, or the cathode admixture first is run through a briquette mill in the step designated 24. In the latter case, the cathode admixture is formed into small pellets that are then fed into the roll mills.

Typically, the compacting step 26 is performed by two to four calendar mills that serve to press the admixture between rotating rollers to provide a freestanding sheet of the cathode material as a continuous tape. The cathode tape preferably has a thickness in the range of from about 0.004 inches to about 0.020 inches. The outer edges of the tape leaving the rollers are trimmed and wound up on a take-up reel, as indicated at 28, to form a roll of the cathode material that is subsequently subjected to a drying step 30 under vacuum conditions. The drying step removes any residual solvent and/or water from the cathode material. Alternatively, the process includes drop wise addition of liquid electrolyte into the cathode mixture prior to rolling to enhance the performance and rate capacity of an assembled electrochemical cell incorporating the cathode material.

After drying, the cathode material is unwound and fed on a conveyor belt, as shown at 32, and moved to a punching machine. The punching operation 34 forms the continuous tape of cathode material into any dimension needed for preparation of the cathode component.

Figure 3:
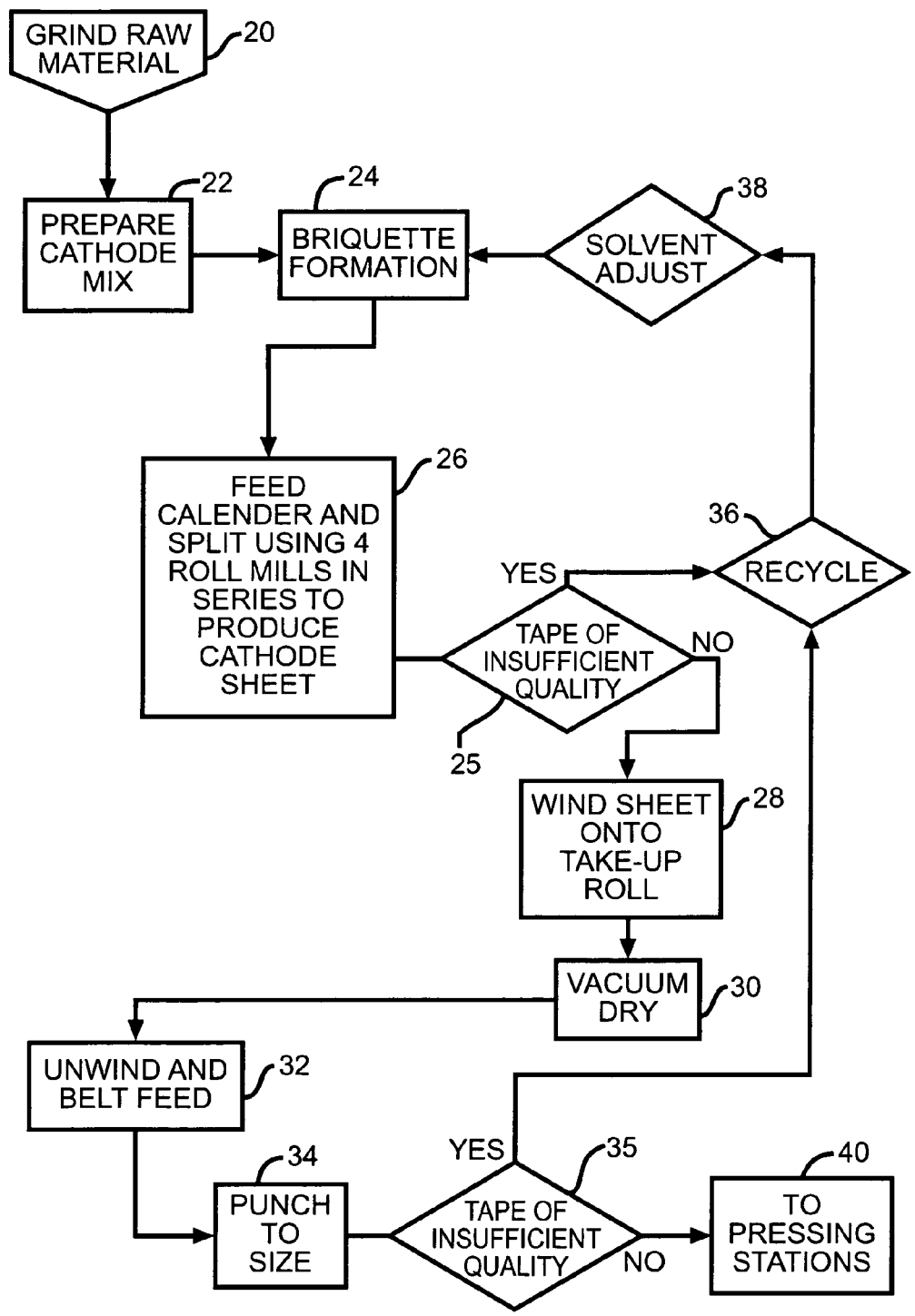
FIG. 3 is a block diagram and flow chart illustrating the steps involved in manufacturing a cathode component from a freestanding sheet of cathode active material for use in an electrochemical cell.

As shown in FIG. 3, the method contains several feedback loops that serve to recycle the cathode active material should the quality control not be up to an acceptable level. This contributes to the process yield, as very little cathode material is lost to waste. After the cathode admixture is pressed during step 26 by the series of calendar mills, if, as represented by conditional box 25, the resulting tape is too thin or otherwise of insufficient quality, the tape is sent to a recycler, indicated as step 36 that reintroduces the cathode material into the feed line entering the calendar mills. If needed, the solvent concentration is adjusted during step 38 as needed, to provide a more uniform consistency to the cathode admixture paste for rolling into the cathode tape. This first recycle step 36 is also useful for reintroducing trimmings and similar leftover cathode material back into the feed line entering the calendar mills.

A second recycle loop, indicated by conditional box 35, removes the cathode material from the process after the punching operation 34 and feeds back into the calendar mills 26 through the recycler indicated in step 36 and the briquette mill in step 24, if that latter step is included in the process, as previously discussed. Again, the solvent concentration is adjusted during step 38 to produce a paste that is suitable for rolling into a tape of uniform cross-sectional thickness.

As previously discussed, upon completion of the drying step 30, the tape of cathode material is sent to the punching operation 34. The punching operation serves to cut the sheet material into cathode plates having a variety of shapes including strips, half-round shapes, rectangular shapes, oblong pieces, or others, that are moved during step 40 to a pressing station for fabrication of the cathode electrode. For a more detailed description of the pressing operation, reference is made to U.S. Pat. Nos. 5,435,874 and 5,571,640, both to Takeuchi et al.

Cathodes prepared as described above may be in the form of one or more plates operatively associated with at least one or more plates of anode material. Alternatively, the cathode may be in the form of a strip wound with a corresponding strip of anode material in a structure similar to a "jellyroll".

The cell of the present invention includes a separator to provide physical separation between the anode and cathode active electrodes. The separator is of electrically insulative material to prevent an internal electrical short circuit between the electrodes, and the separator material also is chemically unreactive with the anode and cathode active materials and both chemically unreactive with and insoluble in the electrolyte. In addition, the separator material has a degree of porosity sufficient to allow flow there through of the electrolyte during the electrochemical reaction of the cell. Illustrative separator materials include non-woven glass, polypropylene, polyethylene, glass fiber material, ceramics, a polytetrafluoroethylene membrane commercially available under the designations ZITEX (Chemplast Inc.), a polypropylene membrane commercially available under the designation CELGARD (Celanese Plastic Company Inc.) and DEXIGLAS (C. H. Dexter, Div., Dexter Corp.).

The form of the separator typically is a sheet that is placed between the anode and cathode electrodes and in a manner preventing physical contact between them. Such is the case when the anode is folded in a serpentine-like structure with a plurality of cathode plates disposed intermediate the anode folds and received in a cell casing or when the electrode combination is rolled or otherwise formed into a cylindrical "jellyroll" or flat folded configuration.

The electrochemical cell of the present invention further includes a nonaqueous, ionically conductive electrolyte that serves as a medium for migration of ions between the anode and the cathode during the electrochemical reactions of the cell. The electrochemical reaction at the cathode involves conversion of ions that migrate from the anode to the cathode in atomic or molecular forms. A suitable electrolyte has an inorganic, ionically conductive salt dissolved in a nonaqueous solvent. More preferably, the electrolyte includes an ionizable alkali metal salt dissolved in a mixture of aprotic organic solvents comprising a low viscosity solvent and a high permittivity solvent. The inorganic, ionically conductive salt serves as the vehicle for migration of the anode ions to intercalate or react with the cathode active materials. Preferably, the ion forming alkali metal salt is similar to the alkali metal comprising the anode. In the case of an anode comprising lithium, the electrolyte salt is selected from $LiPF_6$, $LiBF_4$, $LiAsF_6$, $LiSbF_6$, $LiClO_4$, $LiO_2$, $LiAlCl_4$, $LiGaCl_4$, $LiC(SO_2CF_3)_3$, $LiN(SO_2CF_3)_2$, LiSCN, $LiO_3SCF_3$, $LiC_6F_5SO_3$, $LiO_2CCF_3$, $LiSO_6F$, $LiB(C_6H_5)_4$, $LiCF_3SO_3$, and mixtures thereof.

Low viscosity solvents useful with the present invention include esters, linear and cyclic ethers and dialkyl carbonates such as tetrahydrofuran (THF), methyl acetate (MA), diglyme, trigylme, tetragylme, dimethyl carbonate (DMC), 1,2-dimethoxyethane (DME), 1,2-diethoxyethane (DEE), 1-ethoxy,2-methoxyethane (EME), ethyl methyl carbonate (EMC), methyl propyl carbonate, ethyl propyl carbonate, diethyl carbonate (DEC), dipropyl carbonate, and mixtures thereof. High permittivity solvents include cyclic carbonates, cyclic esters and cyclic amides such as propylene carbonate (PC), ethylene carbonate (EC), butylene carbonate, acetonitrile, dimethyl sulfoxide, dimethyl formamide, dimethyl acetamide, γ-valerolactone, γ-butyrolactone (GBL), N-methyl-pyrrolidinone (NMP), and mixtures thereof. In the present invention, the preferred anode active material is lithium metal and the preferred electrolyte is 0.8M to 1.5M $LiAsF_6$ or $LiPF_6$ dissolved in a 50:50 mixture, by volume, of propylene carbonate and 1,2-dimethoxyethane.

The assembly of the cell described herein is preferably in the form of a wound element cell. That is, the fabricated cathode, anode and separator are wound together in a "jellyroll" type configuration or "wound element cell stack" such that the anode is on the outside of the roll to make electrical contact with the cell case in a case-negative configuration. Using top and bottom insulators, the wound cell stack is inserted into a metallic case of a suitable size dimension. The metallic case may comprise materials such as stainless steel, mild steel, nickel-plated mild steel, titanium or aluminum, but not limited thereto, so long as the metallic material is compatible for use with components of the cell.

The cell header comprises a metallic disc-shaped or rectangular-shaped body with a first hole to accommodate a glass-to-metal seal/terminal pin feedthrough and a second hole for electrolyte filling. The glass used is of a corrosion resistant type having from between about 0% to about 50% by weight silicon such as CABAL 12, TA 23, FUSITE 425 or FUSITE 435. The positive terminal pin feedthrough preferably comprises titanium although molybdenum, aluminum, nickel alloy, or stainless steel can also be used. The cell header comprises elements having compatibility with the other components of the electrochemical cell and is resistant to corrosion. The cathode lead is welded to the positive terminal pin in the glass-to-metal seal and the header is welded to the case containing the electrode stack. The cell is thereafter filled with the electrolyte solution described hereinabove and hermetically sealed such as by close-welding a stainless steel disc or ball over the fill hole, but not limited thereto. This above assembly describes a case-negative cell that is the preferred construction of the exemplary cell of the present invention. As is well known to those skilled in the art, the electrochemical system of the present invention can also be constructed in a case-positive configuration.

Cells built according to the present invention are particularly well suited for powering implantable medical devices such as cardiac pacemakers, defibrillators, neuro-stimulators and drug pumps. For example, an implantable cardiac defibrillator is a device that requires a power source for a generally medium rate, constant resistance load component provided by circuits performing functions such as the heart sensing and pacing functions. This is a medical device monitoring function that requires electrical current of about 1 microampere to about 100 milliamperes. From time-to-time, the cardiac defibrillator may require a generally high rate, pulse discharge load component that occurs, for example, during charging of a capacitor in the defibrillator for the purpose of delivering an electrical shock to the heart to treat tachyarrhythmias, the irregular, rapid heartbeats that can be fatal if left uncorrected. This medical device operating function requires a significantly greater electrical current than the monitoring function of about 1 ampere to about 4 amperes.

Particularly during the medical device operating function, it is important that the cell experience as little voltage delay as possible. Charge time is the key important performance parameter for implantable defibrillators since increasing the length of time necessary to convert the heart back to its normal function decreases the chance of success. A certain amount of energy must be extracted from the battery per charge. The rate at which this occurs is a function of the loaded voltage. The higher the loaded voltage the faster energy can be extracted, and therefore, the shorter the charge time.

An implantable cardiac defibrillator requires energy in the range of from about 40 Joules to about 70 Joules per Li/SVO cell for electrical shock therapy. The relationship is shown below:

$$Energy(J) = I(amp) \times V(volt) \times t(sec.)$$

$$t(s) = Energy\ (J)/IV$$

If the required delivered energy (J) and pulsing current (amp) are both defined, then the charge time in seconds is inversely proportional to the average voltage under pulsing. For a typical pulse discharge application, J=60 Joules and I=2.0 Amps. Under these conditions, every 0.130 V drop in loaded voltage represents an additional 1-second in charge time. Therefore, to maintain a relatively low charge time, the cell must deliver higher voltage under pulsing. This requirement is, however, compromised by the voltage delay and Rdc growth phenomena in the Li/SVO system.

As previously discussed, voltage delay and irreversible Rdc growth begin in a Li/SVO cell at about the middle of discharge life region (about 25% DOD) and continue to about 70% DOD. Under severe conditions, cell voltage under pulsing becomes so low that the charge time is considered too long for the required therapy. This results in shortened device longevity. Since voltage delay and Rdc growth start at about 25% to 40% DOD in a typical Li/SVO cell, it is possible that only up to about 40% of the theoretical capacity of a particular cell is actually delivered. The remaining capacity is wasted. The onset point is, however, dictated by whether the cathode is of a pressed powder design as described in U.S. Pat. Nos. 4,830,940 and 4,964,877, both to Keister et al. or of a freestanding sheet of SVO as described in the previously referenced U.S. Pat. Nos. 5,435,874 and 5,571,640, both to Takeuchi et al. These patents are assigned to the assignee of the present invention and incorporated herein by reference.

Nonetheless, the discharge life of a Li/SVO cell can be divided into three regions. For a pressed powder cathode, the first region ranges from beginning of life to about 35% DOD where voltage delay and irreversible Rdc growth are not significant. The second region ranges from about 35% DOD to about 70% DOD. The third region ranges from about 70% DOD to end of life and is where voltage delay and irreversible Rdc growth are significantly reduced, if not entirely absent again. On the other hand, for a freestanding sheet cathode, the first region ranges from beginning of life to about 25% DOD, the second region ranges from about 25% DOD to about 45% DOD and the third region ranges from about 45% DOD to end of life.

By way of background, a Li/SVO cell is known to have two voltage plateaus. The first occurs at about 3.2 volts and the second at about 2.6 volts. The discharge profile has a first sloping portion between the two plateaus and a second sloping portion from the end of the second plateau to end-of-life at about 2.0 volts. When separation between the corresponding loaded voltages for two comparative cells pulse discharged at different time intervals exceeds about 3%, but occurs during the first plateau instead of the first slope, it is reversible Rdc and does not signal commencement of the second discharge region. All that is required to eliminate the reversible Rdc anode passivation layer is to pulse discharge the cell. This serves to break up and dissipate the passivation layer, thereby eliminating the cause of the reversible Rdc. The problem is that in the second discharge region of a Li/SVO cell, more frequent pulse discharging never completely eliminates the voltage delay phenomenon. It merely lessens its severity to an acceptable amount. This is why the Rdc is termed irreversible. The end of the second discharge region is when the derivative of the loaded voltage reading corresponding to that used to determine onset of this region is zero within 4% of DOD. Depending on the increment used, the derivative approaches zero in an 8% window, for example 58%±4% for a DOD increment of 2%.

Thus, according to the present invention, when the calculation of $P_{last}-P_{min}$ is less than about 20 mV between a first and second pulse-discharged cells at an initial current pulse discharge, i.e., a freshly built or essentially newly discharged cell, there will not be any significant difference in their discharge performance in the second discharge region ranging from about 35% DOD to about 70% DOD for a pressed powder cathode type cell and about 25% DOD to about 45% DOD for a freestanding sheet cathode type cell. On the other hand, when the calculation of $P_{last}-P_{min}$ is greater than about 20 mV between the two cells under pulse discharge conditions at the initial current pulse discharge, there will be a significant difference in their discharge performance in the second discharge region. This means that a difference of 20 in mA/cm$^2$ is a significant increase from one cell to the next. Also, in general, the closer the calculation of $P_{last}-P_{min}$ is to zero, the better a particular cell will perform in relative terms in later stages of its discharge life, particularly in the second discharge region.

The following examples describe the manner and process of an electrochemical cell according to the present invention, and set forth the best mode contemplated by the inventors of carrying out the invention.

EXAMPLE I

Tests cells were constructed having a lithium anode and a cathode comprising silver vanadium oxide activated with an organic electrolyte. The cell design utilized a cathode in the form of a freestanding sheet manufactured according to the previously referenced U.S. Pat. Nos. 5,435,874 and 5,571,640, both to Takeuchi et al. The cathode mixture consisted of, by weight, 94% SVO cathode active material, along with 3% of a PTFE powder, 2% graphite, and 1% carbon black. The sheet was pressed onto an expanded metal current collector, and encapsulated in a polypropylene separator. The anode of each cell was a strip of metallic lithium pressed onto a nickel current collector and also encapsulated in a polypropylene separator. The polypropylene separator for both the anode and the cathode was a 0.001" film laminate. The anode was wrapped accordion style around the cathode plates to provide an active electrode surface area of 95.9 cm$^2$. The cells were filled with a 1 M LiAsF$_6$ dissolved in an equal volume mixture of PC and DME as the electrolyte. The cells were hermetically sealed.

Figure 4:
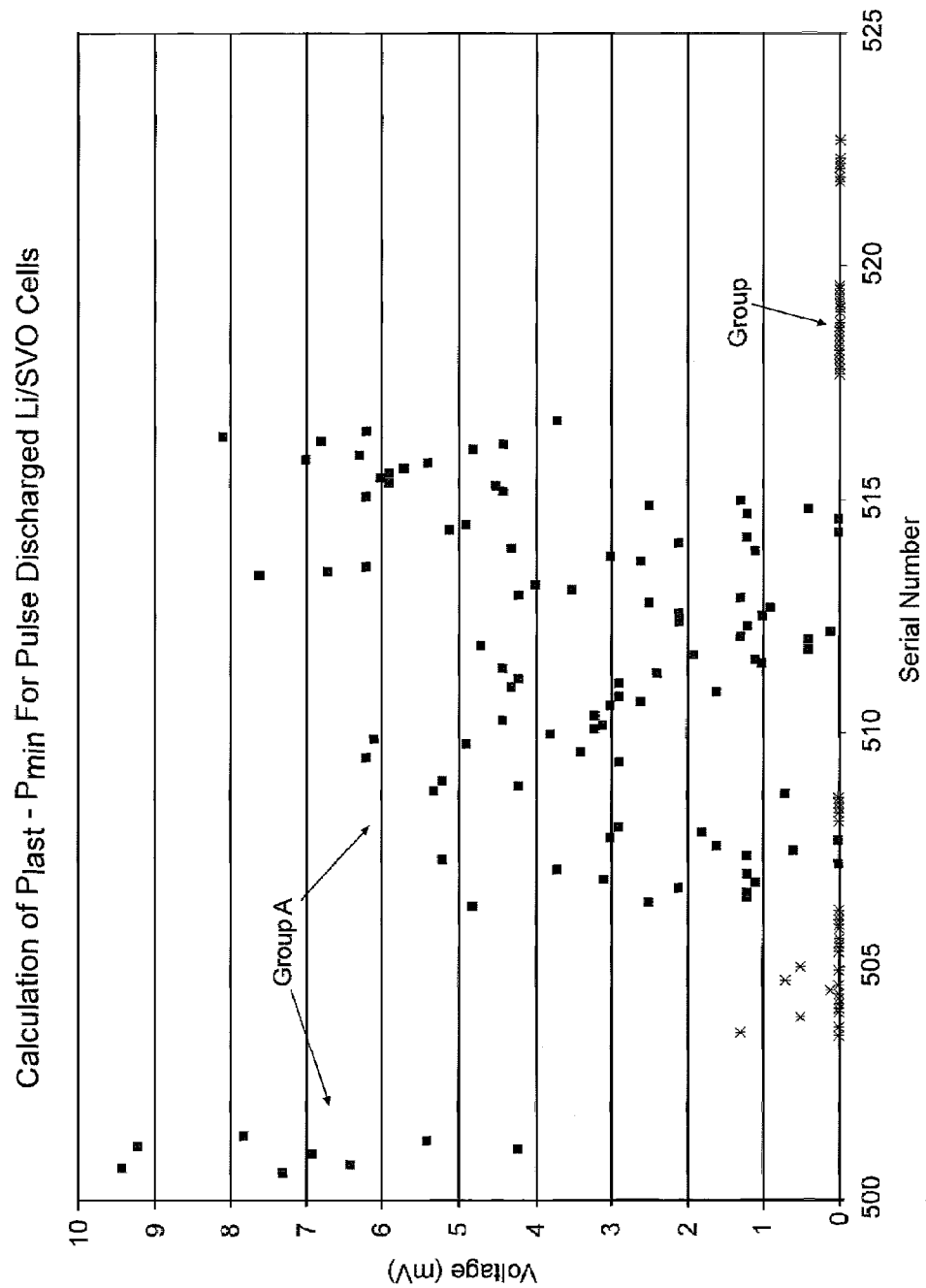
FIG. 4 is a graph showing the results of the calculation of $P_{last}$-$P_{min}$ for a plurality of Li/SVO cells after having been pulse discharged.

The thusly constructed cells underwent a burn-in discharge consisting of the application of four 10-second 2.5 Amp pulses with 15 seconds rest between each pulse. As indicated in FIG. 4, the calculation $P_{last}-P_{min}$ was made and the cells were then divided into Group A cells (square symbols) and Group B cells (star symbols). The conclusion is that, in general, it can be expected that the Group B cells will perform better under pulse discharge in the second discharge region than the Group A cells. Since these test cells are of a freestanding sheet cathode type, the second region ranges from about 25% DOD to about 45% DOD.

EXAMPLE II

Twelve of the cells from Example I were then discharged under loads of 17.4 KΩ. Six cells from each group were then subjected to a 12 month accelerated discharge data (ADD) regime consisting of a pulse train comprising four 2.5 A, 10 second pulses (26.1 mA/cm$^2$) with 15 seconds rest between each pulse. One such pulse train was superimposed on the background load every 30 days. The 12-month ADD is designed to deplete the cells of 100% of their theoretical capacity in 12 months.

Figure 5:
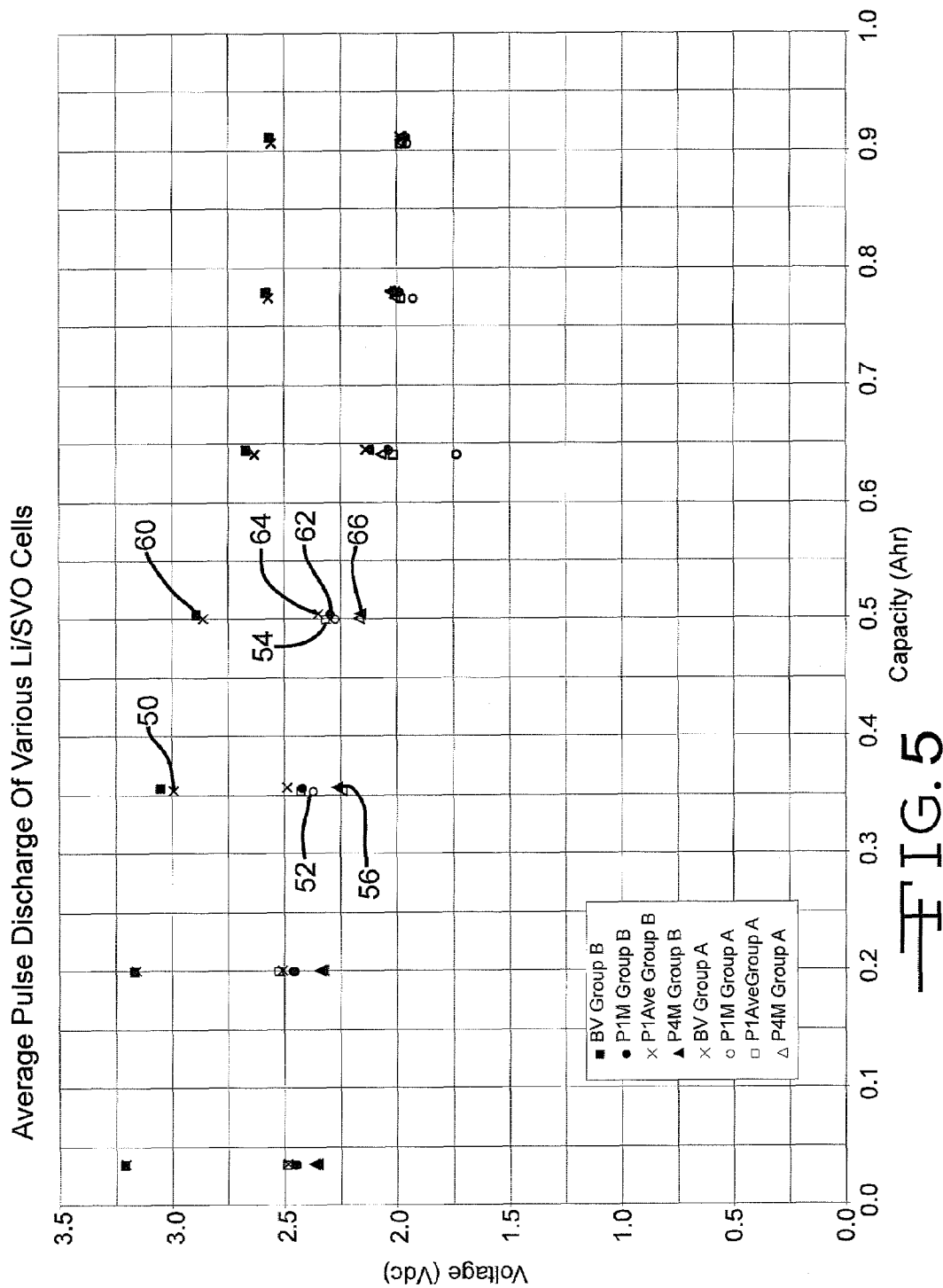
FIGS. 5 and 6 illustrate the average pulse discharge results of a plurality of Li/SVO cells under different discharge regimes.

The results are presented in FIG. 5 where curve 50 was constructed from the average background voltage of the Group A cells, curve 52 was constructed from the average pulse 1 minima voltage, curve 54 was constructed from the average of the average voltage throughout the ten second pulse and curve 56 was constructed from the average pulse 4 minima voltage. In comparison, curve 60 was constructed from the average background voltage of the Group B cells, curve 62 is of the average pulse 1 minima voltage, curve 64 is of the average of the average voltage throughout the ten second pulse and curve 66 is of the average pulse 4 minima voltage.

EXAMPLE III

Figure 6:
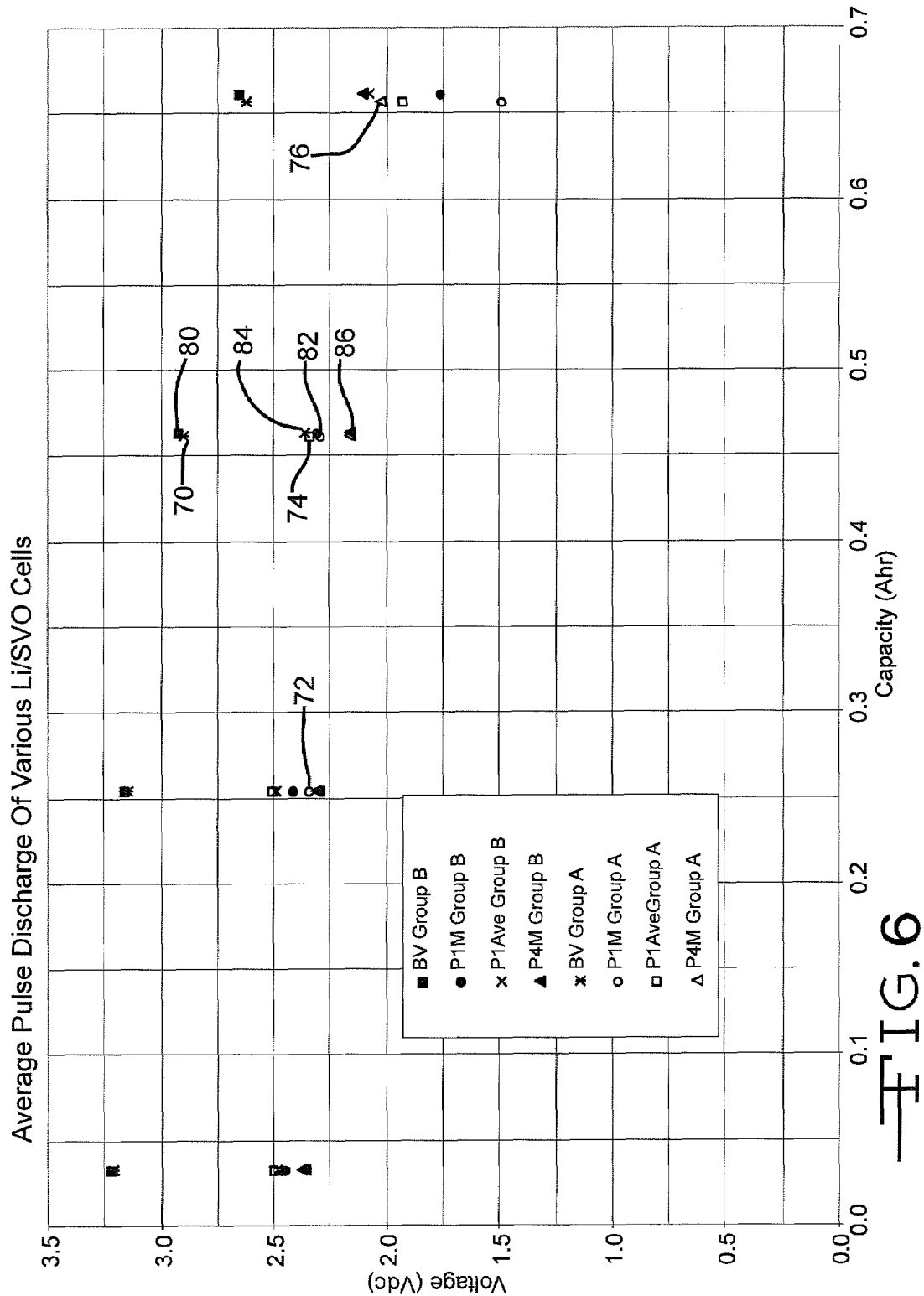

Six additional cells from each group in Example I were subjected to a 1-year ADD regime consisting of a pulse train comprising four 2.5 A, 10 second pulses (26.1 mA/cm$^2$) with 15 seconds rest between each pulse. One such pulse train was superimposed on the background load each 2 months. The 1-year ADD is designed to deplete the cells of 70% of their theoretical capacity in one year. The results are presented in FIG. 6 where curve 70 was constructed from the average background voltage of the Group A cells, curve 72 was constructed from the average pulse 1 minima voltage, curve 74 was constructed from the average of the average voltage throughout the ten second pulse and curve 76 was constructed from the average pulse 4 minima voltage. In comparison, curve 80 was constructed from the average background voltage of the Group B cells, curve 82 is of the average pulse 1 minima voltage, curve 84 is of the average of the average voltage throughout the ten second pulse and curve 86 is of the average pulse 4 minima voltage.

In the discharge regimes described in Examples II and III, a significant separation is evident between the two groups of cells at middle of life corresponding to the second discharge region even though initially the Group A cells slightly outperformed the Group B cells. The causes of voltage delay within the initial pulse may be specific or widespread, and may be due to: oxidation or other resistances developed on the anode or cathode, or the current collectors, moisture content within the cell, or residual solvents remaining from the processing of the SVO.

It is appreciated that various modifications to the inventive concepts described herein may be apparent to those of ordinary skill in the art without departing from the spirit and scope of the present invention as defined by the appended claims.

What is claimed is:

1. A method for powering an implantable medical device, comprising the steps of:
   a) providing a first electrochemical cell and a second electrochemical cell, each comprising a lithium-containing anode and a cathode comprising an active material selected from the group consisting of silver vanadium oxide, copper silver vanadium oxide, copper vanadium oxide, manganese dioxide, titanium disulfide, copper oxide, copper sulfide, iron sulfide, iron disulfide, carbon, fluorinated carbon, and mixtures thereof activated with a nonaqueous electrolyte, wherein the cathode active material of the first and second cells is the same;
   b) discharging the first and second cells during a burn-in when they are essentially in a freshly built state to each deliver a first pulse or a first pulse train under a load, each pulse being of electrical current of a significantly greater amplitude than that of a pre-pulse current immediately prior to the pulse;
   c) recording a pulse minimum voltage ($P_{min}$) and a final voltage ($P_{last}$) during the first pulse discharges prior to the load being removed;
   d) calculating $P_{last}-P_{min}$ for the first cell and then for the second cell;
   e) determining that during further discharge there will not be any significant difference in the voltage delay performance between the first and second cells when a difference between the result of the calculation for the first cell and the result of the calculation for the second cell is about 20 mV or less, and wherein when the difference is greater than about 20 mV, determining that there will be a significant difference in the voltage delay performance between the first and second cells; and
   f) when the first cell is determined not to be significantly different than the second cell in terms of its discharge performance, incorporating the first cell into the implantable medical device as a power source.

2. The method of claim 1 including discharging each of the first and second cells to deliver at least two pulses of electrical current in a relatively short succession with or without open circuit rest between the pulses.

3. The method of claim 2 including deriving $P_{last}$ and $P_{min}$ from a first pulse of the at least two pulses.

4. The method of claim 1 including discharging each of the first and second cells to deliver a pulse train consisting of four pulses with a rest period between each pulse.

5. The method of claim 4 including providing the rest period being about 15 seconds.

6. The method of claim 1 including providing the pulse of a current density ranging from about 15 mA/cm$^2$ to about 50 mA/cm$^2$.

7. The method of claim 1 including providing the pulse of about 1 amp to about 4 amps.

8. The method of claim 1 including providing the cathode comprising from about 80 weight percent to about 99 weight percent of the cathode active material.

9. The method of claim 1 including providing the cathode comprising at least one of a binder material and a conductive additive.

10. The method of claim 9 including when the cathode comprises a binder material, it is a fluoro-resin powder.

11. The method of claim 9 including when the cathode comprises a conductive additive, selecting it from the group consisting of carbon, graphite powder, acetylene black, and mixtures thereof.

12. The method of claim 1 including providing the cathode comprising about 0 to 3 weight percent carbon, about 1 to 5 weight percent of a powder fluoro-resin and about 94 weight percent of the cathode active material.

13. The method of claim 1 including providing the cathode by mixing the active material with a solvent material to form a paste comprising the cathode active material followed by subjecting the paste to a first pressing step forming the paste into a cathode sheet, then removing any residual solvent material from the cathode sheet, followed by forming the cathode sheet to provide at least one cathode plate, and then laminating at least one of the thusly formed cathode plates on at least one side of a current collector by subjecting the cathode plate to a second pressing step to provide a laminated cathode component as the cathode.

14. A method for powering a device with a cell comprising a lithium-containing anode and a cathode of an active material selected from the group consisting of silver vanadium oxide, copper silver vanadium oxide, copper vanadium oxide, manganese dioxide, titanium disulfide, copper oxide, copper sulfide, iron sulfide, iron disulfide, carbon, fluorinated carbon, and mixtures thereof activated with a non-aqueous electrolyte, comprising the steps of:
   a) discharging the cell during a burn-in when it is essentially in a freshly built state to deliver a first pulse or a first pulse train, each pulse being of electrical current of a significantly greater amplitude than that of a pre-pulse current immediately prior to the pulse;
   b) recording a pulse minimum voltage ($P_{min}$) and a final voltage ($P_{last}$) during the first pulse discharge;
   c) calculating $P_{last}-P_{min}$ for the cell;
   d) comparing a result of the calculation from step c) with data derived from carrying out steps a), b) and c) on a reference cell of a similar anode and cathode chemistry during a first pulse or pulse train discharge of the reference cell;

e) determining on the basis of the comparison of step d) whether the cell will experience increased voltage delay when the cell is further discharged based on the difference between the $P_{last}-P_{min}$ voltage calculated in step c) for the cell and the $P_{last}-P_{min}$ voltage derived from carrying out steps a), b) and c) on the reference cell being greater than or less than about 20 mV, respectively; and f) when the cell is determined not to be significantly different than the reference cell in terms of its discharge performance, incorporating the cell into the device as a power source.

15. The method of claim 14 including discharging each of the cells to deliver at least two pulses of electrical current in a relatively short succession with or without open circuit rest between the pulses.

16. The method of claim 15 including deriving $P_{last}$ and $P_{min}$ from a first pulse of the at least two pulses.

17. The method of claim 14 including discharging each of the cells to deliver a pulse train consisting of four pulses with a rest period between each pulse.

18. The method of claim 17 including providing the rest period being about 15 seconds.

19. The method of claim 14 including providing the pulse of a current density ranging from about 15 mA/cm$^2$ to about 50 mA/cm$^2$.

20. The method of claim 14 including providing the pulse of about 1 amp to about 4 amps.

* * * * *

UNITED STATES PATENT AND TRADEMARK OFFICE
CERTIFICATE OF CORRECTION

PATENT NO. : 7,263,449 B1 Page 1 of 1
APPLICATION NO. : 11/015991
DATED : August 28, 2007
INVENTOR(S) : Gary Freitag It is certified that error appears in the above-identified patent and that said Letters Patent is hereby corrected as shown below:

Column 4, line 30, delete "contact by" and insert --contact or by--.

Column 4, line 48, delete "$Cu_xAg_yV_2O$" and insert -- $Cu_xAg_yV_2O_z$ --.

Column 4, line 54, delete "$Cu_{0.5}Ag_{0.5}V_2O$" and insert -- $Cu_{0.5}Ag_{0.5}V_2O_z$ --.

Signed and Sealed this

Twentieth Day of May, 2008

JON W. DUDAS
*Director of the United States Patent and Trademark Office*